US008228606B2

(12) United States Patent
Lin et al.

(10) Patent No.: US 8,228,606 B2
(45) Date of Patent: Jul. 24, 2012

(54) CONTIGUOUS MICROLENS ARRAY AND PHOTOMASK FOR DEFINING THE SAME

(75) Inventors: Yu-Tsung Lin, Taichung County (TW); Hsin-Ping Wu, Hsinchu (TW); Hung-Chao Kao, Taipei (TW); Ming-I Wang, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 381 days.

(21) Appl. No.: 11/970,936

(22) Filed: Jan. 8, 2008

(65) Prior Publication Data

US 2009/0174945 A1 Jul. 9, 2009

(51) Int. Cl.
*G02B 27/10* (2006.01)
(52) U.S. Cl. ........................................ 359/619; 359/620
(58) Field of Classification Search .................... 359/619
See application file for complete search history.

(56) References Cited

U.S. PATENT DOCUMENTS

| 6,388,278 B1 | 5/2002 | Suzuki et al. |
| 6,933,972 B2 | 8/2005 | Suzuki et al. |
| 7,006,294 B2 | 2/2006 | Steenblik et al. |
| 2003/0112523 A1* | 6/2003 | Daniell .......................... 359/626 |
| 2006/0170810 A1 | 8/2006 | Kim |
| 2008/0290383 A1* | 11/2008 | Dunne et al. ................... 257/292 |

FOREIGN PATENT DOCUMENTS

| CN | 1497268 A | 5/2004 |
| CN | 1731586 A | 2/2006 |
| JP | 2004-296590 A | 10/2004 |

OTHER PUBLICATIONS

TW Patent office search report issued on Dec. 31, 2011.

* cited by examiner

*Primary Examiner* — James Jones
(74) *Attorney, Agent, or Firm* — WPAT., P.C.; Justin King

(57) ABSTRACT

A contiguous microlens array including a plurality of contiguous microlenses is described. Each microlens has substantially circular contours at the heights higher than the connection sections of the microlens with neighboring microlenses, and has substantially partially circular contours at the heights on the connection sections adjacent to the neighboring microlenses. The shape of the curved surface of a microlens in the microlens array is selectively adjusted according to its position in the array and the incident angle of light incident thereto.

18 Claims, 11 Drawing Sheets

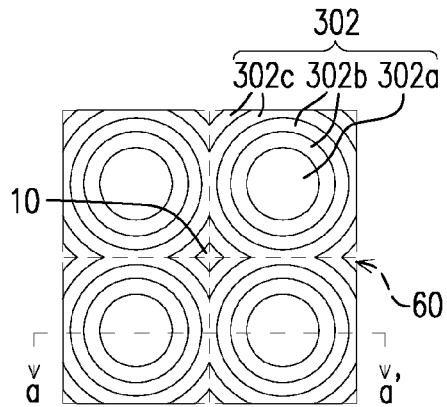
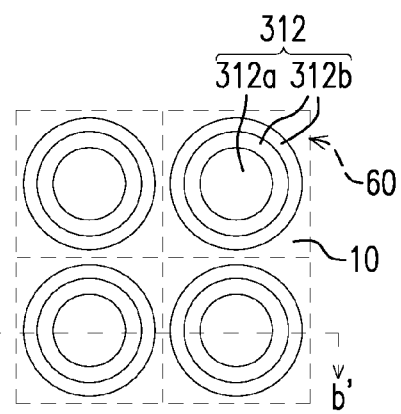
FIG. 4A  FIG. 4B
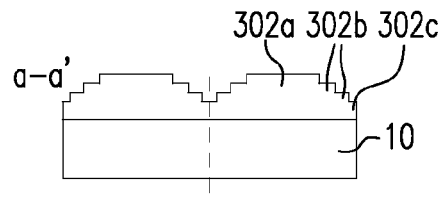
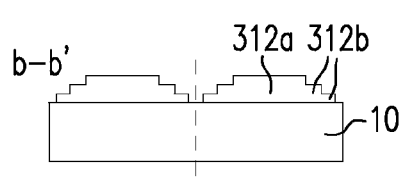
FIG. 5A-1  FIG. 5B-1
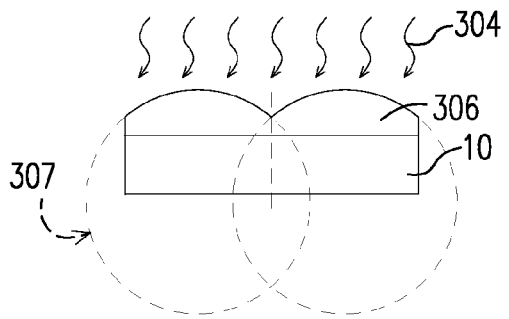
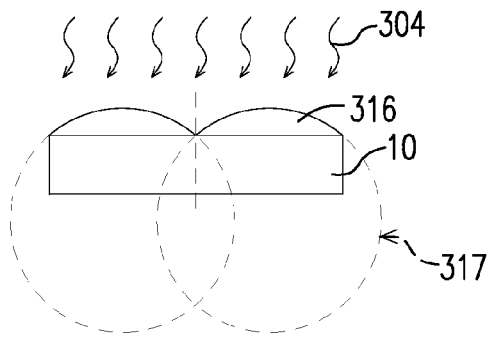
FIG. 5A-2  FIG. 5B-2
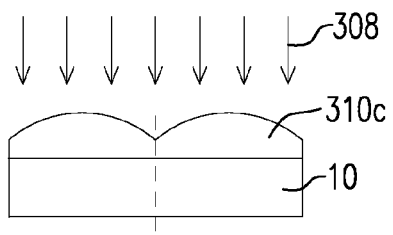
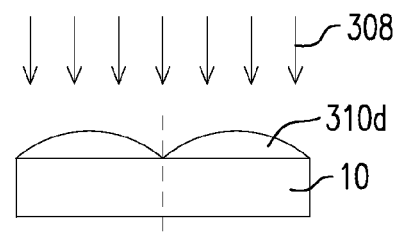
FIG. 5A-3  FIG. 5B-3

CONTIGUOUS MICROLENS ARRAY AND PHOTOMASK FOR DEFINING THE SAME

BACKGROUND OF THE INVENTION

1. Field of Invention

This invention relates to an image recording apparatus, and more particularly to a contiguous microlens array, a method of fabricating the same and a photomask for defining the same, which can be applied to any image recording apparatus that requires focusing light on photosensing devices.

2. Description of Related Art

In a semiconductor-type image recording apparatus like a charge-coupled device (CCD) or CMOS image recording apparatus, a microlens array is often disposed over the array of photosensing devices to enhance the sensitivity of the same, wherein one microlens focuses light on one photosensing device.

FIG. 1A is a local contour plot of a conventional microlens array, and FIG. 1B shows the height variations of one microlens in two vertical cross-sectional views at different angles. Because a microlens 110 is formed by reflowing a square photoresist pattern formed on a based layer 10, the shapes of the lower contours thereof are close to squares, as shown in FIG. 1A, so that the microlens 110 has different curvatures in vertical cross-sectional views at different angles. For example, the curvature of the 45° cross section (B-B') is relatively smaller than that of the 0° cross section (A-A'), as shown in FIG. 1B, so that the microlens 110 is insufficient in the focusing effect. Moreover, because neighboring microlenses 110 are not connected with each other and there are planar sections without a focusing effect between them, the incident light are not fully collected so that the light focusing is not quite effective.

There is also an issue on the integration of the conventional microlens array with other elements in a image recording apparatus, which is described below with a CMOS image recording apparatus having photodiodes as photosensing devices as an example. Referring to FIG. 2 schematically showing a part of a CMOS image recording apparatus in the prior art, the microlens array 100 is formed on a transparent base layer 10, which includes a color filter array 12 and other functional layers on a multi-level interconnect structure 20 including a first-level interconnect layer 22 and a second-level interconnect layer 24 over a photodiode array 30. The eyepiece 40 of the CMOS image recording apparatus is disposed above the microlens array 100, apart from it by a certain distance.

Because the incident angle of the light incident to a microlens 110 in a peripheral portion of the microlens array 100 overly deviates from 90° (the direction of 90° means the normal line direction of the image sensor chip, hereinafter) so that the focus of light is not directly under the microlens 110, the microlens 110 is laterally shifted relative to the corresponding photodiode 30 to make the light focus on the latter, as shown in FIG. 2. However, this makes the exit light 50a from the microlens 110 partially blocked by the second-level interconnect layer 24 and thus lowers the recording accuracy of the image. This problem can be solved by laterally shifting portions of the $2^{nd}$-level interconnect layer 24 under the peripheral part of the microlens array 100, but the interconnect circuit design would become more complicated by doing so.

SUMMARY OF THE INVENTION

Accordingly, this invention provides a contiguous microlens array that can solve the issue of poor focusing in the prior art and may even allows the peripheral part of an image to be recorded accurately without position shifts of some interconnect structures.

This invention also provides a method of fabricating a contiguous microlens array, which can be used to form a contiguous microlens array of this invention.

This invention also provides a photomask that can be applied to the method of fabricating a contiguous microlens array of this invention.

It is particularly noted that the adjective "polygonal" corresponds to a polygon having more than four edges in the entire specification and claims of this invention.

A contiguous microlens array of this invention includes a plurality of contiguous microlenses. Each microlens has substantially circular contours at the heights higher than the connection sections of the microlens with neighboring microlenses and has substantially partially circular contours at heights on the connection sections adjacent to the neighboring microlenses.

In the above contiguous microlens array of this invention, each connection section may have a thickness close to zero.

In an embodiment, the contiguous microlens array is disposed over a photodiode array with at least one interconnect layer between them. A color filter array may be further disposed between the at least one interconnect layer and the microlens array.

In an embodiment, the microlens array is disposed over an array of photosensing devices with one microlens therein corresponding to one photosensing device, wherein each microlens is substantially symmetric in any vertical cross-sectional view. The microlens array is divided into a central part and at least one peripheral part therearound according to different incident angles of incident light, wherein a microlens in the central part is aligned with the corresponding photosensing device, and a microlens in the peripheral part is laterally shifted relative to the corresponding photosensing device. The surface of each microlens may substantially be a curved surface, such as a partial spherical surface. The array of photosensing devices may be an array of photodiodes or an array of charge-coupled devices (CCDs).

In another embodiment, each microlenses is aligned with the corresponding photosensing device, a microlens in the central part is substantially symmetric in any vertical cross-sectional view and a microlens in the at least one peripheral part has an asymmetric vertical cross section. The surface of any microlens may substantially be a curved surface. In the central part of the contiguous microlens array, the surface of a microlens may substantially be a partial spherical surface.

The method of fabricating a microlens array of this invention is described below. An array of photoresist patterns is formed, wherein each photoresist pattern has a substantially circular or polygonal shape in the top view and neighboring photoresist patterns are connected with each other or close to each other. A reflow step is performed, which heats the photoresist patterns to round the surface of each photoresist pattern and connect the neighboring photoresist patterns that are close to each other as formed. A fixing step is then performed to fix the shape of each photoresist pattern.

In an embodiment, the fixing step includes irradiating the photoresist patterns with UV-light. In another embodiment, the fixing step includes further heating the photoresist patterns at a temperature higher than that set in the reflow step.

In some embodiments, the surface of each photoresist pattern as formed has a non-uniform height distribution, and the height of the surface decreases from inner to outer. In such a case, the array of photoresist patterns may be defined by a single photomask on which a photomask pattern corresponding to a photoresist pattern has a transparency distribution such that the surface of the photoresist pattern as formed has a non-uniform height distribution.

In a case where the surface of each photoresist pattern has a non-uniform height distribution, each photoresist pattern may include a pillar part having a substantially circular or polygonal shape in the top view and at least one annular segment around the pillar part. The at least one annular segment has a substantially circular or polygonal shape in the top view and has a height lower than that of the pillar part. When a photoresist pattern includes two or more annular segments, the annular segments are different in the heights and the heights decrease from inner to outer. The array of photoresist patterns may be defined by a single photomask that includes a transparent substrate and an array of photomask patterns thereon. In an embodiment, one photomask pattern corresponds to one photoresist pattern in the array of photoresist patterns, neighboring photomask patterns are disposed apart from each other by a distance that allows neighboring photoresist patterns defined thereby to be connect with or close to each other, and each photomask pattern has therein at least one annular partition line that exposes a portion of the transparent substrate and has a substantially circular or polygonal shape.

In cases where one photoresist pattern includes a pillar part and at least one annular segment therearound as mentioned above, the array of photoresist patterns may be formed over an array of photosensing devices with one photoresist pattern corresponding to one photosensing device. The array of photoresist patterns may be divided into a central part and at least one peripheral part therearound according to different incident angles of incident light. In an embodiment, the center of the pillar part of each photoresist pattern substantially coincides with the center of the at least one annular segment of the same in the top view, a photoresist pattern in the central part is aligned with the corresponding photosensing device, and a photoresist pattern in the at least one peripheral part is laterally shifted relative to the corresponding photosensing device. In an alternative embodiment, the region in which a photoresist pattern is located is aligned with the corresponding photosensing device. In a top view of a photoresist pattern in the central part, the center of the pillar part coincides with the center of the at least one annular segment. In a top view of a photoresist pattern in the at least one peripheral part, the center of the pillar part and that of the at least one annular segment both are shifted relative to that of the region in which the photoresist pattern is located. In addition, the array of photosensing devices may be an array of photodiodes or an array of charge-coupled devices (CCDs).

The photomask for defining a contiguous microlens array of this invention includes a transparent substrate and an array of photomask patterns. In the array of photomask patterns, neighboring photomask patterns are disposed apart from each other by a distance that allows neighboring photoresist patterns defined thereby to be connected with or close to each other, and each photomask pattern has a transparency distribution such that it can define a photoresist pattern having a surface with a non-uniform height distribution and the height of the surface decreases from inner to outer.

In some embodiments, a photomask pattern has therein at least one annular partition line that exposes a portion of the transparent substrate and has a substantially circular or polygonal shape.

In an embodiment, the contiguous microlens array is formed over an array of photosensing devices, wherein one microlens corresponds to one photomask pattern and one photosensing device. In each photomask pattern, the center of the at least one annular partition line coincides with that of the photomask pattern. The microlens array is divided into a central part and at least one peripheral part therearound, according to different incident angles of incident light. The photomask pattern for defining a microlens in the central part is aligned with the corresponding photosensing device, but the photomask pattern for defining a microlens in the at least one peripheral part is laterally shifted relative to the corresponding photosensing device. In another embodiment, the region in which a photomask pattern is located is aligned with the corresponding photosensing device. In a photomask pattern for defining a microlens in the central part, the center of the at least one annular partition line coincides with that of the region in which the photomask pattern is located. In a photomask pattern for defining a microlens in the at least one peripheral part, the center of the at least one annular partition line is shifted relative to that of the region in which the photomask pattern is located. The array of photosensing devices may be an array of photodiodes or an array of charge-coupled devices (CCDs).

Since each microlens in the microlens array of this invention has substantially circular or regular-polygonal contours at the heights higher than the connection sections of the same with neighboring microlenses and has substantially partially circular contours at heights on the connection sections adjacent to the neighboring microlenses, when a microlens is substantially symmetric in any vertical cross-sectional view, the variation in the curvatures of the vertical cross sections of all angles in the microlens is less than that in a prior-art microlens having a square-like bottom and a circular top, so that the microlens has a better focusing effect. Moreover, in an embodiment where no gap is present between neighboring microlenses, the incident light can be fully collected to raise the light collection efficiency because there is no planar section in the contiguous microlens array.

Moreover, in an embodiment wherein a microlens in the at least one peripheral part of the microlens array with incident light angles overly deviating from 90° has an asymmetric vertical cross section, the average exit angle of light from the asymmetric microlens can be made close to 90°. Hence, each microlens in both the central and peripheral parts of the microlens array is allowed to align with the corresponding photosensing device without a lateral shift relative to the latter, so that the interconnect structures under the peripheral part of the microlens array are not necessary to shift and no modification is required for the interconnect circuit design.

In order to make the aforementioned and other objects, features and advantages of the present invention comprehensible, a preferred embodiment accompanied with figures is described in detail below.

BRIEF DESCRIPTION OF THE DRAWINGS

FIG. 4A and FIG. 4B respectively illustrate, according to the first embodiment of this invention, two examples of a contiguous microlens array wherein neighboring microlenses are entirely connected with each other without a gap between them (4A) or are connected with each other just at their edges (4B).

FIGS. 5A-1 to 5A-3 and FIGS. 5B-1 to 5B-3 respectively illustrate, according to the first embodiment of this invention, two examples of a method of fabricating a contiguous microlens array shown in FIGS. 4A and 4B, respectively.

DESCRIPTION OF EMBODIMENTS

First Embodiment

In the 1$^{st}$ embodiment of the invention, each microlens is substantially symmetric in any vertical cross-sectional view. A microlens in the central part of the microlens array is aligned with the corresponding photosensing device, and a microlens in the at least one peripheral part of the same is laterally shifted relative to the corresponding photosensing device so that light is focused on the latter. Since FIG. 2 has illustrated such a design, the latter figures relating to the first embodiment do not show again the arrangements of the microlenses in different parts of the microlens array relative to the photosensing devices.

Moreover, since a microlens in the central part of the array is aligned with the corresponding photosensing device, the photoresist pattern as a precursor of a microlens in the central part and the photomask pattern for defining a microlens in the central part both are aligned with the corresponding photosensing device. Since a microlens in the peripheral part is laterally shifted relative to the corresponding photosensing device, both the photoresist pattern as a precursor of a microlens in the peripheral part and the photomask pattern for defining a microlens in the peripheral part are laterally shifted relative to the corresponding photosensing device. The alignment/shift of a photoresist pattern or a photomask pattern relative to the corresponding photosensing device is not illustrated here because it is easily understandable to one of ordinary skill in the art.

Figure 3A:
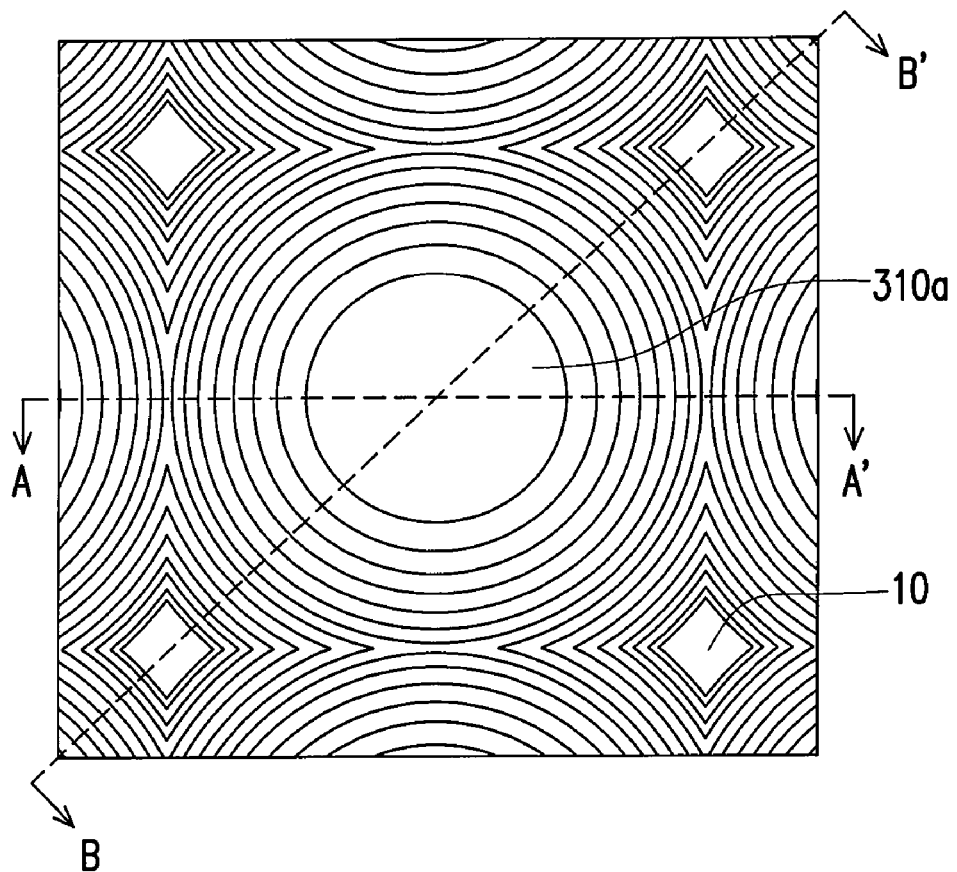
FIG. 3A is a local contour plot of a contiguous microlens array of an example in a first embodiment of this invention.
Figure 3B:
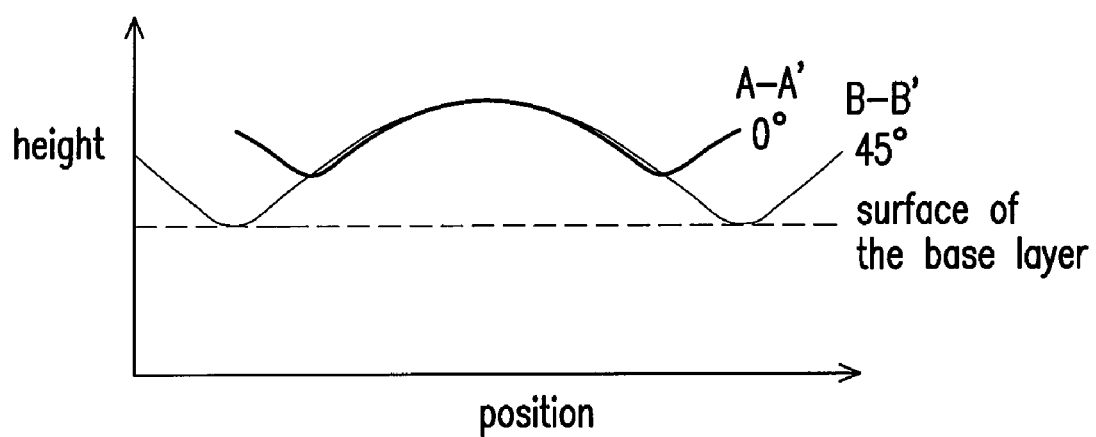
FIG. 3B shows the height variations of one microlens in two vertical cross-sectional views at different angles.

FIG. 3A is a local contour plot of a contiguous microlens array in one example of the first embodiment of this invention. The microlens array includes a plurality of contiguous microlenses 310$a$ disposed on a base layer 10. Each microlens 310$a$ has substantially circular contours at the heights higher than the connection sections of the same with neighboring microlenses 310$a$, and has substantially partially circular contours at the heights on the connection sections adjacent to the neighboring microlenses 310$a$. As indicated by the contours in FIG. 3A, each microlens 310$a$ is substantially symmetric in any vertical cross-sectional view, and has substantially the same curvature in the vertical cross-sectional views at all angles. As shown in FIG. 3B, the curvature of the 45° cross section (B-B') is substantially the same as that of the 0° cross section (A-A'). In this example, neighboring microlenses 310$a$ are not entirely connected with teach other, and small gaps are formed between them exposing small portions of the base layer 10.

Figure 3C:
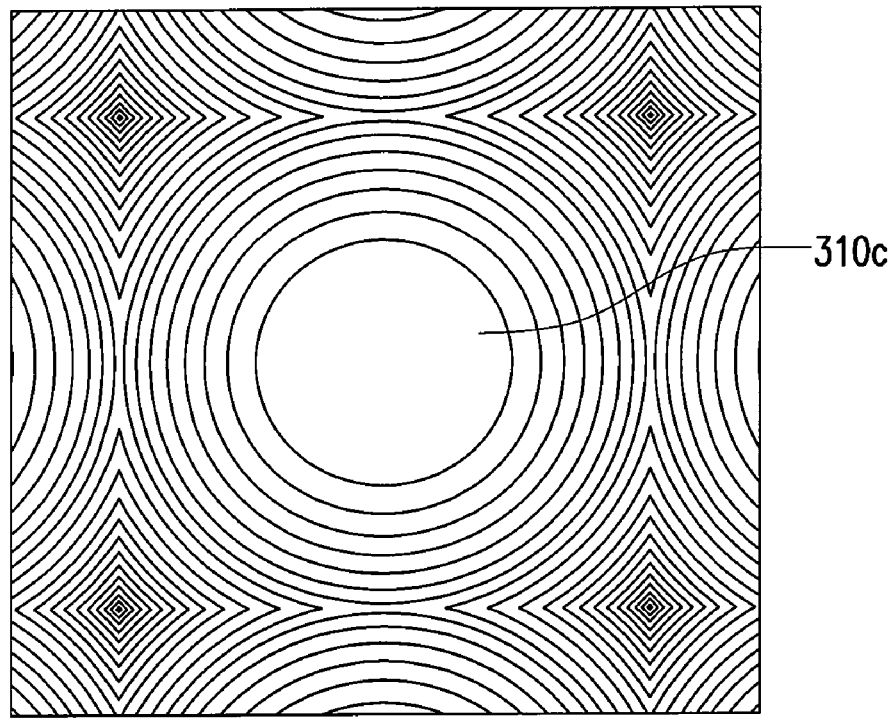
FIGS. 3C and 3D are local contour plots of the contiguous microlens arrays of two other examples in the first embodiment of this invention.
Figure 3D:
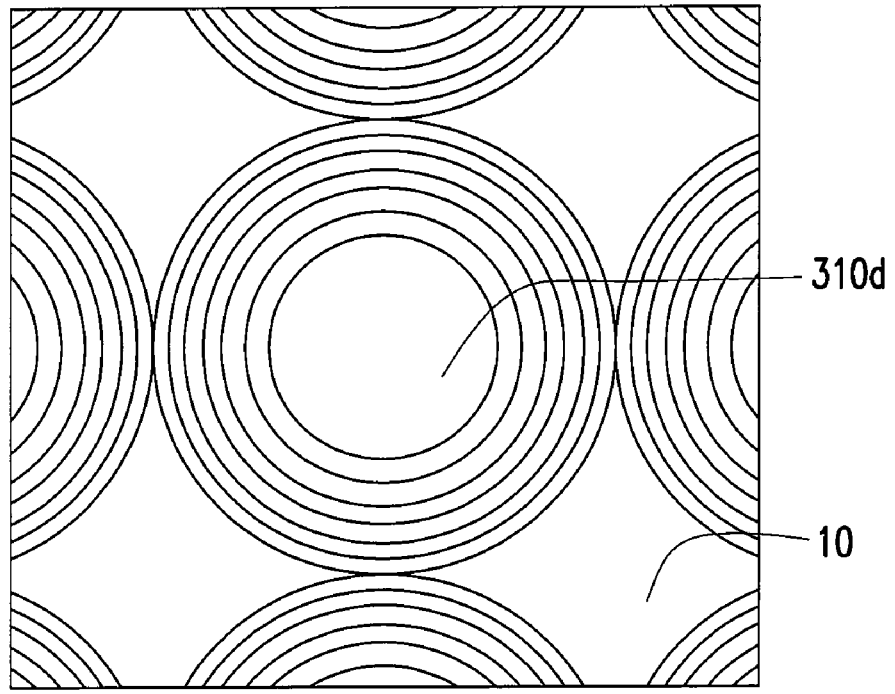

FIGS. 3C and 3D are local contour plots of two contiguous microlens arrays respectively in two other examples of the first embodiment of this invention.

Referring to FIG. 3C, the structure of the contiguous microlens array of this example is similar to that shown in FIG. 3A except that neighboring microlenses 310$c$ are entirely connected with each other without a gap exposing the base layer 10 between them. Because neighboring microlenses 310$c$ are contiguous in any direction, the incident light can be fully collected to achieve more effective light focusing.

Figure 1A:
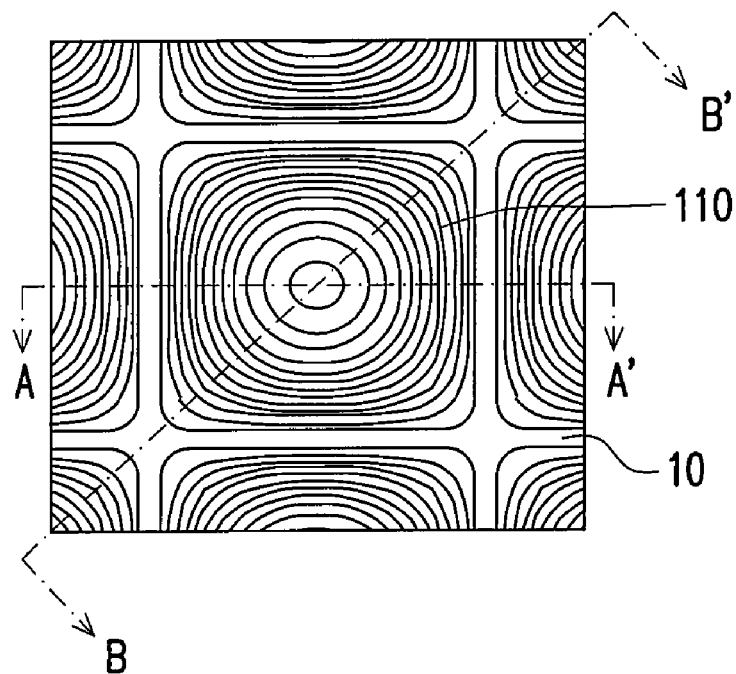
FIG. 1A is a local contour plot of a conventional microlens array.

Referring to FIG. 3D, the structure of the contiguous microlens array of this example is similar to that shown in FIG. 3A except that the connection section of any two neighboring microlenses 310$d$ has a thickness of zero, i.e., any two neighboring microlenses 310$d$ just contact with each other at their edges. However, because variations are inevitable in a real fabricating process, it is impossible to make any two neighboring microlenses 310$d$ just contact with each other at their edges. Accordingly, it is more accurate to state that each connection section has a thickness "close to" zero in consideration of the real fabricating process. The light collection efficiency of such a microlens can be up to about 78%, which is still notably higher than that (~65%) of a conventional microlens with a square-like bottom and a round top as shown in FIG. 1A.

FIG. 4A and FIG. 4B respectively illustrate, according to the first embodiment of this invention, two examples of a contiguous microlens array wherein neighboring microlenses are entirely connected with each other without a gap between them (4A) or are connected with each other just at their edges (4B). FIGS. 5A-1 to 5A-3 and FIGS. 5B-1 to 5B-3 respectively illustrate, according to the first embodiment of this invention, two examples of a method of fabricating a contiguous microlens array shown in FIGS. 4A and 4B, respectively.

Referring to FIGS. 4A/4B and 5A-1/5B-1, a plurality of photoresist patterns 302/312 are formed, as an array of photoresist patterns, respectively in a plurality of regions 60 predetermined for forming microlenses. Each photoresist pattern 302/312 has a substantially circular shape in the top view, and neighboring photoresist patterns as formed are connected with each other (302) or are close to each other (312), so that neighboring photoresist patterns are connected with each other after the reflow step. Each photoresist pattern 302/312 includes a pillar part 302$a$/312$a$ having a substantially circular shape in the top view and a number of annular segments 302$b$(c)/312$b$ around the pillar part 302$a$/312$a$ each having a substantially circular shape in the top view and having a height smaller than that of the pillar part 302$a$/312$a$. The annular segments 302$b$(c)/312$b$ are different in the height and the height thereof decreases from inner to outer.

It is particularly noted that the annular segments of a photoresist pattern 302 in FIG. 4A include the intact annular segments 302b and partial annular segments 302c therearound, both of which are generally called "annular segments" in the specification and claims of this invention. The partial annular segments 302c of a photoresist patter 302 are connected with those of the neighboring photoresist patterns 302. For a partial annular segment 302c, the center thereof is defined as the center of an imaginary intact annular segment including the partial annular segments 302c itself. Moreover, as shown in FIG. 4A/4B, in each photoresist pattern 302/312, the center of the pillar part 302a/312a substantially coincides with that of each annular segment 302b(c)/312b and also with that of the corresponding region 60 predetermined for forming the microlens.

Referring to FIG. 4A, the outmost annular segments 302c of four neighboring photoresist patterns 302 enclose a small gap that exposes a small portion of the base layer 10. Moreover, the shape of each of the pillar part 302a and the annular segments 302b(c) can be changed to a polygonal shape, as indicated by the reference characters 302', 302a', 302b' and 302c' in FIG. 5C. Since the corners of polygonal photoresist patterns will be rounded in the later reflow step, the microlenses formed therefrom are similar to those formed from circular photoresist patterns.

Figure 1B:
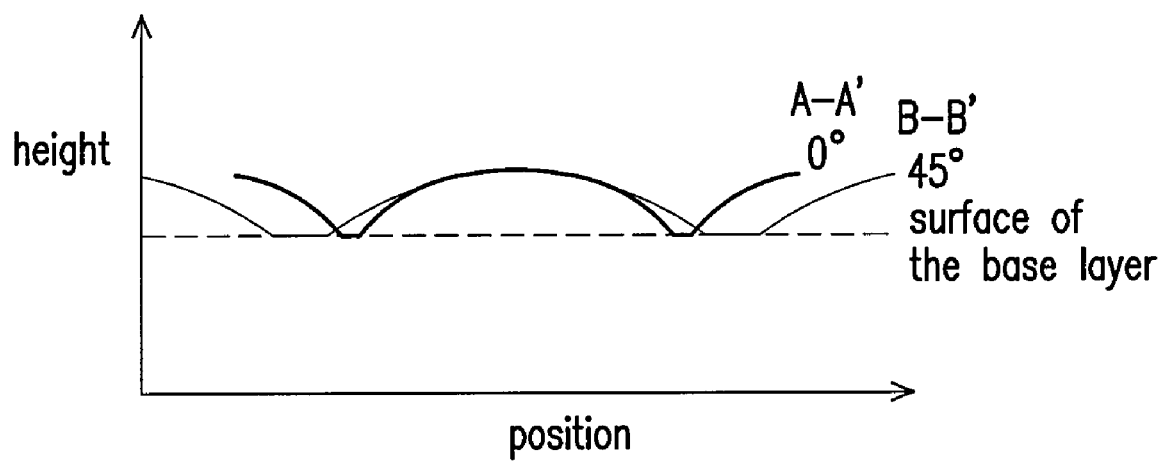
FIG. 1B shows the height variations of each microlens in two vertical cross-sectional views at different angles.
Figures 5C, 5D:
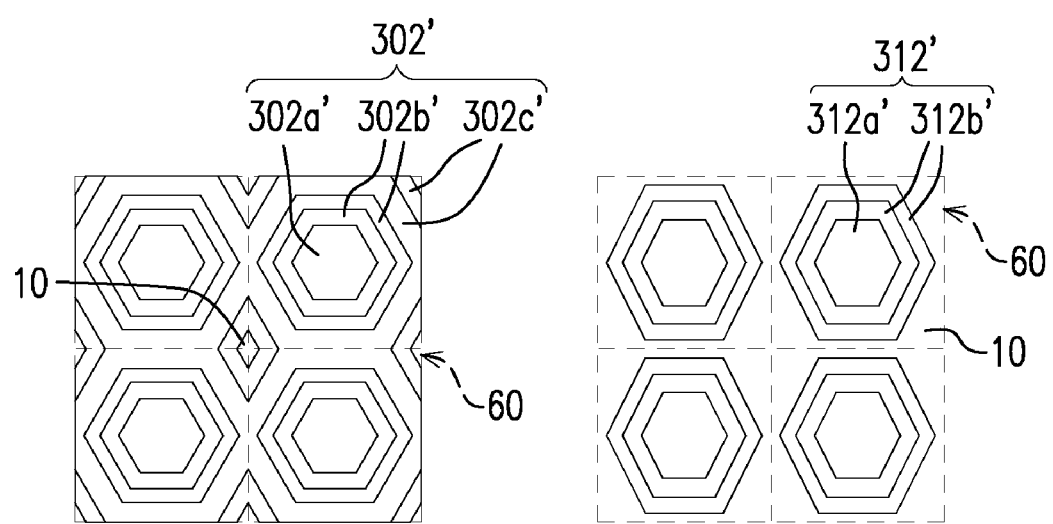
FIG. 5C/5D illustrates exemplary polygonal photoresist patterns that can be converted to microlenses similar to those shown in FIG. 3C/3D.

Differently, the annular segments of a photoresist pattern 312 in FIGS. 5B-1 include intact annular segments 312b only, wherein the outmost intact annular segments 312b of neighboring photoresist patterns 312 are sufficiently close to each other so that the neighboring photoresist patterns 312 are connected with each other after the reflow step. The shape of each of the pillar part 312a and the annular segments 312b can also be changed to a polygonal shape in the example, as indicated by the reference characters 312', 312a' and 312b' in FIG. 5D. Since the corners of the polygonal photoresist patterns will be rounded in the later reflow step, the microlenses formed therefrom are similar to those formed from circular photoresist patterns.

Figure 2:
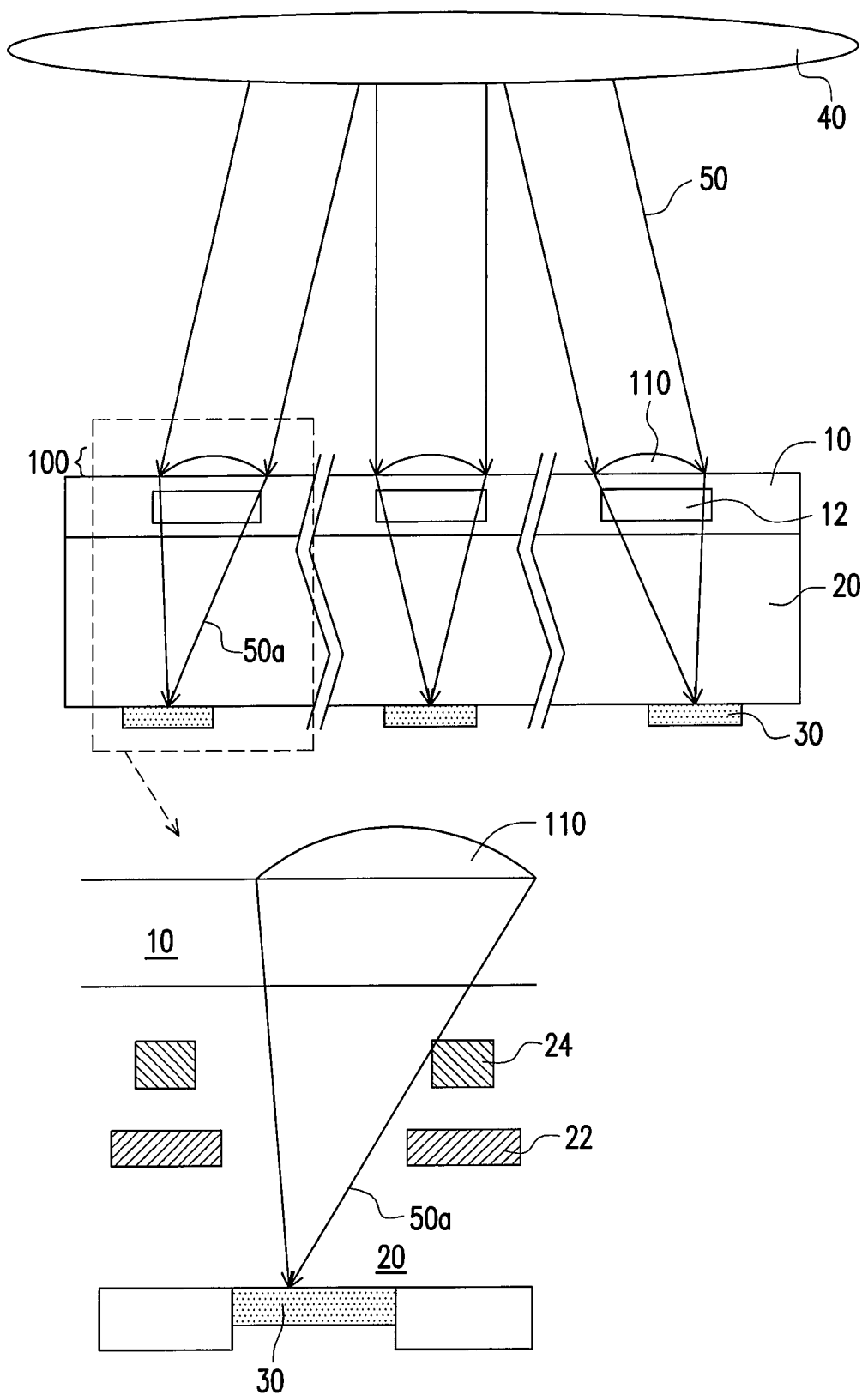
FIG. 2 schematically shows a part of a CMOS image recording apparatus in the prior art.

Referring to FIGS. 5A-2/5B-2, a reflow step 304 is performed, including heating the above photoresist patterns 302/312 to round their surfaces and thereby form surface-rounded photoresist patterns 306/316. The reflow step 304 may be conducted at a temperature of about 120-140° C. for about 10-15 minutes. When the surface of each photoresist pattern 302/312 has a proper height distribution, the surface of each surface-rounded photoresist pattern 306/316 can be close to a part of a spherical surface 307/317 that is namely a partial spherical surface.

Moreover, for the photoresist pattern array in FIG. 4A and FIGS. 5A-1, the photoresist material of the outmost annular segments 302c of four neighboring photoresist patters 302 flows into the small gap between them in the reflow step so that each microlens has a curved surface covering all the corresponding region 60 predetermined for its formation. For the photoresist pattern array in FIG. 4B and FIGS. 5B-1, the photoresist material of the outmost annular segment 312b of each photoresist pattern 312 flows outward in the reflow step so that neighboring photoresist patterns 312 which are not connected with each other as formed are connected with each other.

Referring to FIGS. 5A-3/5B-3, a fixing step 308 is then performed to remove the residual solvent in each surface-rounded photoresist patterns 306/316 and thereby fix the shape of the same to form a microlens 310c/310d. In an embodiment, the fixing step 308 uses UV-light to irradiate the photoresist patterns 306/316, wherein the wavelength of the UV-light used may be about 365 angstroms, the intensity of the UV-light may be about 300 mJ/cm2 and the processing time may be about 10-15 minutes. In another embodiment, the fixing step 308 includes further heating the surface-rounded photoresist patterns 306/316 at a temperature higher than that set in the reflow step 304, such as a temperature within the range of 180-200 C. The processing time may be about 10-15 minutes.

Figure 6A:
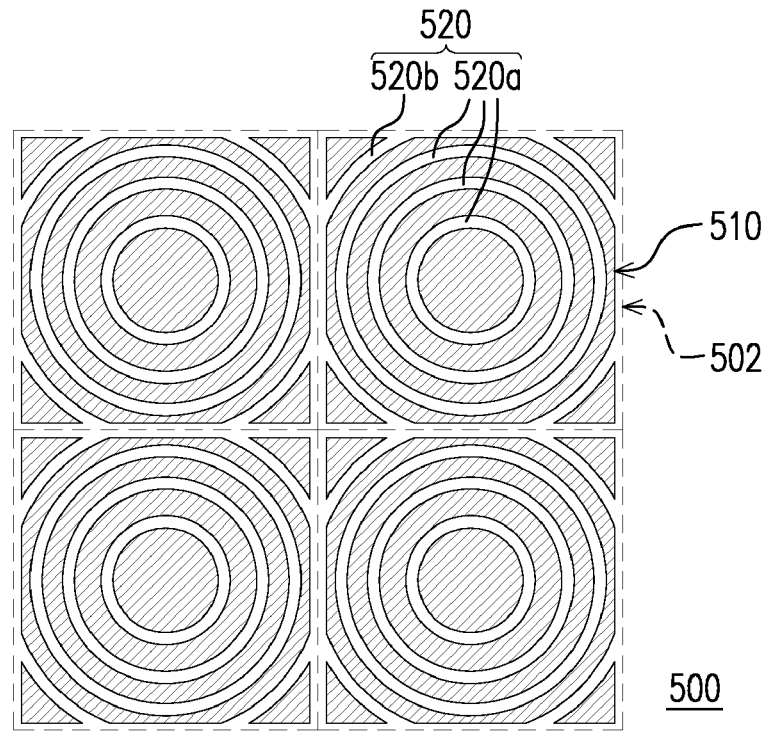
FIG. 6A/6B shows exemplary photomask patterns that can define the photoresist patterns of FIGS. 5A-1/5B-1 according to the first embodiment of this invention.

Exemplary photomask patterns that can define the photoresist patterns in FIGS. 4A-4B are illustrated in FIG. 6A/6B. The photomask includes a transparent substrate 500/530, and a plurality of photomask patterns 510/540 thereon that are disposed in the regions 502/532 corresponding to the regions 60 predetermined for the microlenses and constitute a photomask pattern array corresponding to the microlens array to be defined.

In the example of FIG. 6A, each photomask pattern 510 is typically a square unit pattern apart from the neighboring photomask patterns 510 and has therein a number of annular partition lines 520 that expose portions of the transparent substrate 500 and are for defining the annular segments of the photoresist pattern. In a photomask pattern 510, one of any two neighboring annular partition lines 520 is surrounded by the other of the two neighboring annular partition lines 520. The annular partition lines 520 include intact annular partition lines 520a and partial annular partition lines 520b therearound, both of which are generally called "annular partition lines" in the specification and claims of this invention.

Moreover, the distance between neighboring photomask patterns 510 is small enough so that the neighboring photoresist patterns defined thereby are not disconnected. Each annular partition line 520 is sufficiently narrow such that no annular trench pattern is formed in the photoresist layer but the irradiation on the region around the portion of the photoresist corresponding to the partition line 520 is raised, so that the photoresist layer in the region is partially removed to form an annular segment of a photoresist pattern. Accordingly, when there are two or more annular partition lines 520, the photoresist pattern defined by the photomask pattern 510 has a number of annular segments that descend stepwise in the height from inner to outer, as shown in FIGS. 5A-1. Moreover, because there are two straight partition lines crossing in the region between four neighboring photomask patterns 510, the photoresist material in the region is entirely removed to form the small gap between the corresponding four neighboring photoresist patterns, as shown in FIG. 4A.

Figure 6B:
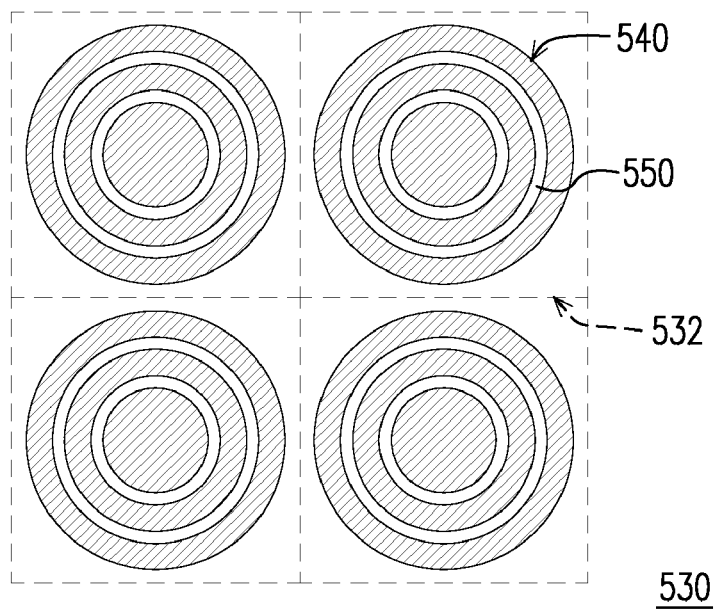
FIG. 6C/6D shows exemplary photomask patterns that can define the photoresist patterns of FIG. 5C/5D according to the first embodiment of this invention.
Figure 6C:
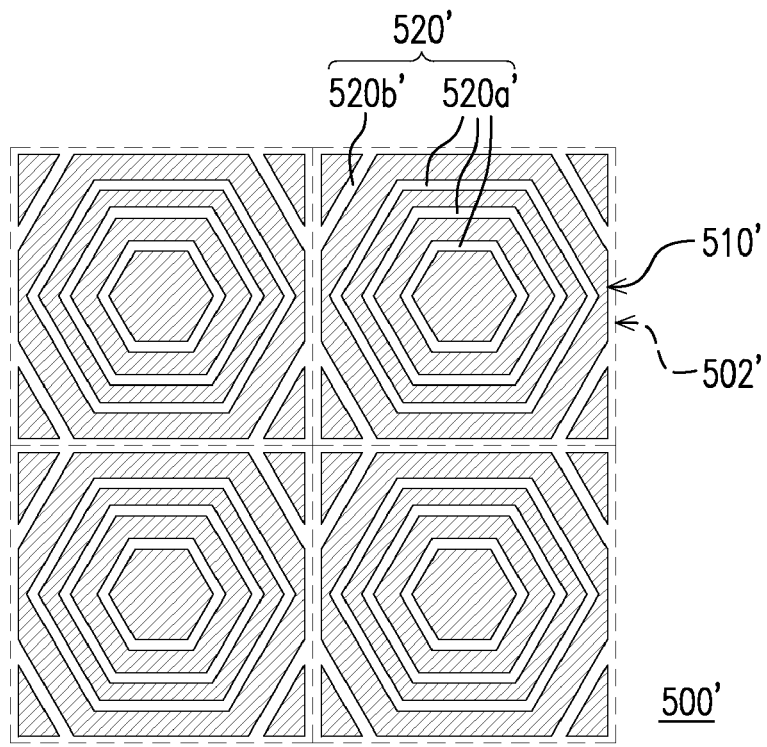
Figure 6D:
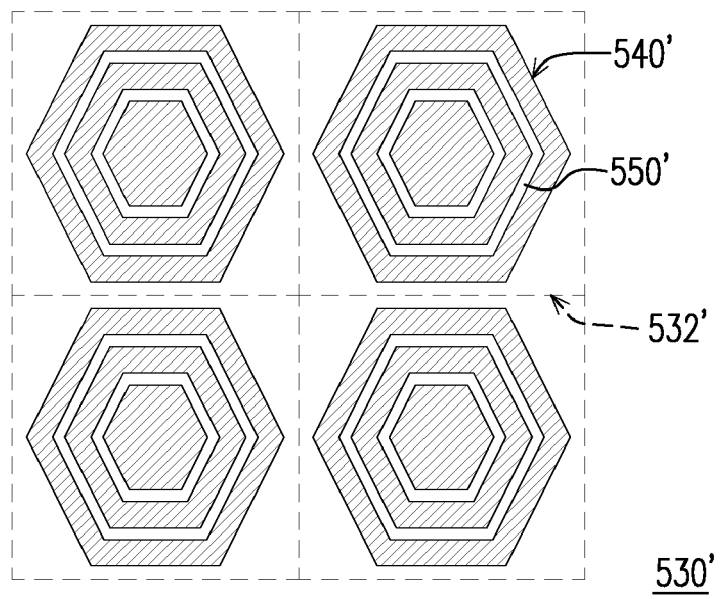

In the example of FIG. 6B, the photomask patterns 540 are circular patterns, each of which includes a number of annular partition lines 550 exposing portions of the transparent substrate 530 that are all intact annular partition lines, wherein any two neighboring annular partition lines 550 are in the relationship of inner and outer rings. Neighboring photomask patterns 540 are properly spaced from each other such that the neighboring photoresist patterns defined thereby are not connected with each other until the reflow step is conducted. The effect of the annular partition lines 550 is the same as that of the annular partition lines 520 in FIG. 6A, so that the photoresist pattern defined by such a photomask pattern 540 also has a number of annular segments that descend stepwise in the height from inner to outer, as shown in FIGS. 5B-1.

Exemplary photomask patterns that can define the photoresist patterns in FIG. 5C/5D are illustrated in FIG. 6A/6D. The photomask patterns can be derived from FIG. 6A/6B by changing the above circular annular partition lines 520(a/b), circular photomask patterns 540 and circular annular partition lines 550 to polygonal annular partition lines 520' (including 520a' and 520b'), polygonal photomask patterns 540' and polygonal annular partition lines 550'. In addition, the transparent substrate is labeled with 500'/530', the region corresponding to a region 60 predetermined for forming a microlens is labeled with 502'/532', and the square unit pattern corresponding to a microlens to be defined is labeled with 510'.

Moreover, by properly adjusting at least one of the thickness and the absorption coefficient of the photoresist layer as well as the number and the width of the partition line(s), the envelop of the disk-like portions of a photoresist pattern can be close to a partial spherical surface with a required curvature so that the microlens formed from the photoresist pattern through the reflow step has a surface close to the partial spherical surface with the required curvature.

In this embodiment, since each microlens has substantially circular or regular-polygonal contours at the heights higher than the connection sections of the microlens with neighboring microlenses, has substantially partially circular contours at heights on the connection sections adjacent to the neighboring microlenses and is substantially symmetric in any vertical cross-sectional view, the curvature variation over the cross sections of all angles in the microlens is smaller than that in a conventional microlens with a squire-like bottom and a circular top so that the microlens provides better focusing than the conventional one. Moreover, in a case where no gap is present between neighboring microlenses, the incident light can be fully collected to increase the light collection efficiency because there is no planar section in the contiguous microlens array.

Second Embodiment

In the second embodiment of this invention, each microlens is aligned with the corresponding photosensing device, a microlens in a central part of the microlens array is substantially symmetric in any vertical cross-sectional view, and a microlens in the peripheral part of the microlens array has an asymmetric vertical cross section.

Figure 7:
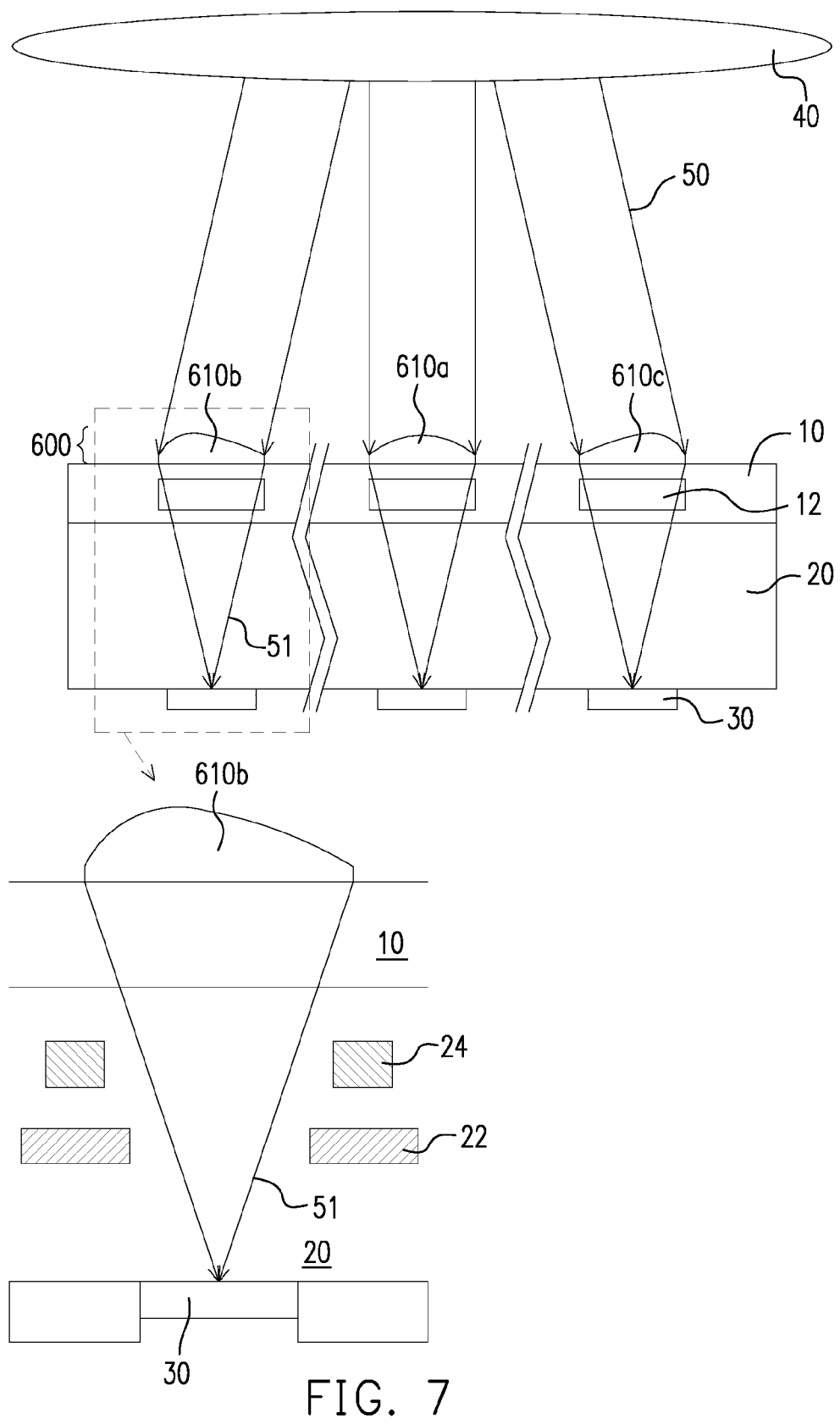
FIG. 7 schematically illustrates a part of an example of a CMOS image recording apparatus including a contiguous microlens array of a second embodiment of this invention.

A CMOS image recording apparatus including photodiodes as the photosensing devices is taken as an example again in the second embodiment. FIG. 7 schematically shows a part of an example of such a CMOS image recording apparatus. The structure of the CMOS image recording apparatus is similar to that shown in FIG. 2 except the shapes and positions of microlenses 610*a/b/c* in the microlens array 600. Specifically, the microlens array 600 is formed on a transparent base layer 10, which includes a color filter array 12 and other functional layers and is disposed on a multi-level interconnect structure 20 including a first-level interconnect layer 22 and a second-level interconnect layer 24 over the array of photodiodes 30. The eyepiece 40 of the image recording apparatus is disposed above the microlens array 600, apart from it by a certain distance.

A microlens 610*a* in the central part of the microlens array 600 is substantially symmetric in any vertical cross-sectional view, and a microlens 610*b/c* in the peripheral part of the array 600 has an asymmetric vertical cross section. It is noted that the center-shift direction of an asymmetric microlens 610*b/c* is set according to the incident angle of light, such that the incident light 50 overly deviating from 90° is converted to exit light 51 having an average exit angle close to 90° that focuses on the photodiode 30 directly under the microlens 610*b/c*. For example, the center of the left asymmetric microlens 610*b* is shifted left as being subjected to incident light inclining toward the right side, while the center of the right asymmetric microlens 610*c* is shifted right as being subjected to incident light inclining toward the left side.

Figure 8A:
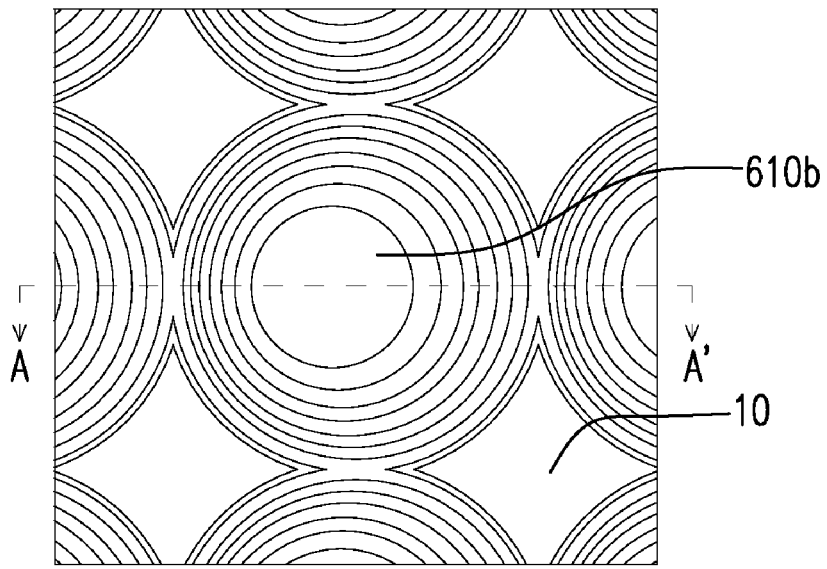
FIG. 8A shows a local contour plot in a contiguous microlens array according to the second embodiment.
Figure 8B:
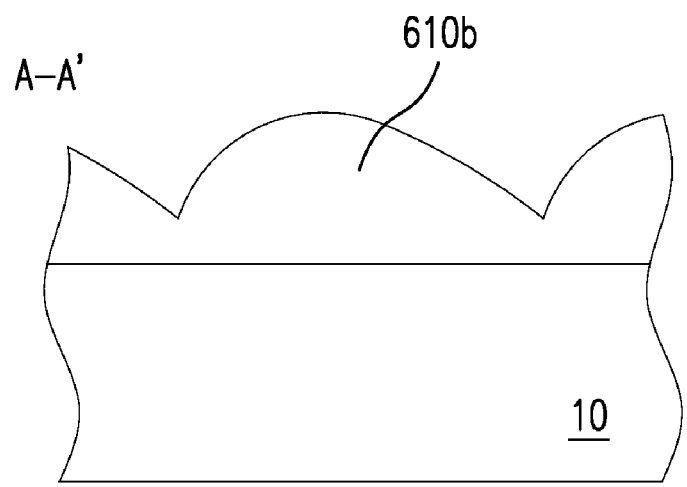
FIG. 8B shows a cross-sectional view of some contiguous asymmetric microlenses shown in FIG. 8A.

FIG. 8A shows a local contour plot of some contiguous asymmetric microlenses 610*b* and FIG. 8B shows a cross-sectional view of FIG. 8A, while the structures of the asymmetric microlenses 610*c* and those in other portions of the peripheral part can be known based on FIGS. 8A and 8B. As shown in FIGS. 8A and 8B, each microlens 610*b* also has substantially circular contours at heights above the connection sections of the same with neighboring microlenses 610*b*. As in the cases of FIG. 3D, it is also possible that the thickness of each connection section is alternatively close to zero.

Figure 9A:
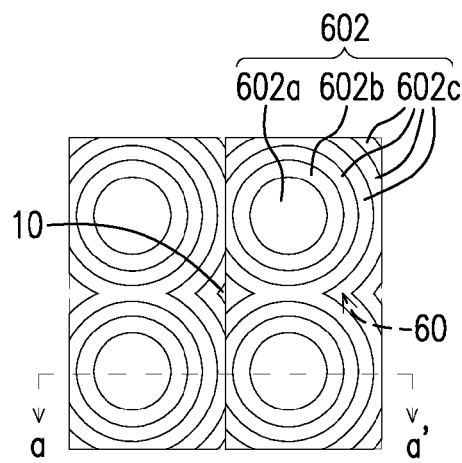
FIG. 9A shows a top view of some photoresist patterns formed as the precursors of some asymmetric microlenses in a method of fabricating a contiguous microlens array according to the second embodiment of this invention.
Figure 9B:
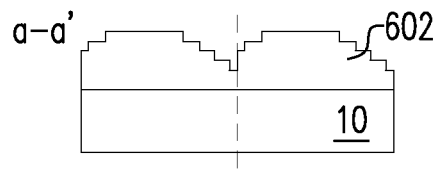
FIG. 9B shows a cross-sectional view of some photoresist patterns formed as the precursors of some asymmetric microlenses shown in FIG. 9A.

FIG. 9A depicts a top view and FIG. 9B depicts a cross-sectional view of exemplary photoresist patterns that can serve as the precursors of the asymmetric microlenses 610*b*, wherein each photoresist pattern 602 includes a pillar part 602*a* having a substantially circular shape in the top view and a number of annular segments 602*b/c* therearound that are lower than the pillar part 602*a* and different in the heights, wherein the heights thereof decreases from inner to outer. It is particularly noted that the intact annular segments 602*b* and the partial annular segments 602*c* therearound both are generally called "annular segments" in the specification and claims of this invention. Meanwhile, the center of a partial annular segment 602*c* is defined as the center of an imaginary intact annular segment that includes the partial annular segment 602*c* itself.

In the top view of a photoresist patter 602, the center of the pillar part 602*a* and that of the annular partition line 602*b/c* both are shifted relative to the center of the region 60 in which the photoresist patter 602 is located. Moreover, it is also possible to form a photoresist pattern including a polygonal pillar part and at least one polygonal annular segment therearound, which can be easily understood based on the above mentioned and are not illustrated in the drawings.

Figure 10:
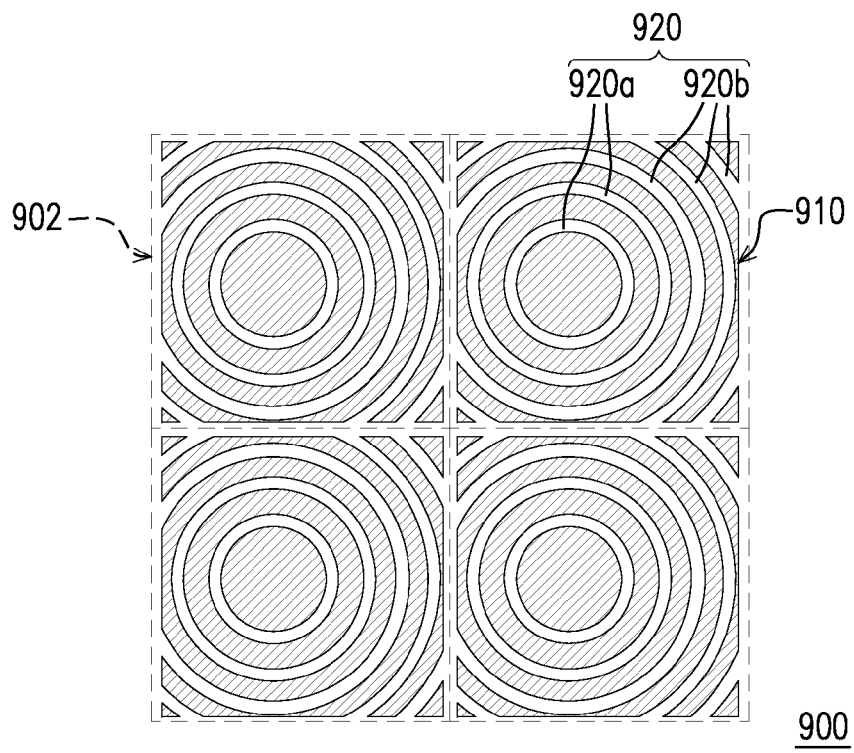
FIG. 10 illustrates exemplary photomask patterns that can define the photoresist patterns of FIG. 9A according to the second embodiment of this invention.

FIG. 10 illustrates exemplary photomask patterns that can define the photoresist patterns in FIG. 9A according to the second embodiment. The photomask patterns 910 are formed on a transparent substrate 900 in the areas 902 corresponding to the regions 60 predetermined for forming the microlenses 610*b*, along with the photomask patterns for defining the microlenses 610*a*, 610*c* and so forth.

Each photomask pattern 910 is substantially a square unit pattern and has therein annular partition lines 920 that expose portions of the transparent substrate 900 and are for defining the annular segments of a photoresist pattern. The annular partition lines 920 include intact annular partition lines 920*a* and partial annular partition lines 920*b* therearound. Moreover, the distance between neighboring photomask patterns 910 is sufficiently small so that the neighboring photoresist patterns defined thereby are not disconnected from each other. It is particularly noted that the intact annular partition lines 920*a* and the partial annular partition lines 920*b* both are generally called "annular partition lines" in the specification and claims of this invention, while the center of a partial annular partition line 920*b* is defined as the center of an imaginary intact annular partition line that includes the partial annular partition line 920*b* itself.

Moreover, in a photomask pattern 910, the center of each annular partition line 920*a/b* is laterally shifted relative to that of the region 902 in which the photomask pattern 910 is located. In addition, each annular partition line 920*a/b* is sufficiently narrow so that the photoresist pattern defined by a photomask pattern 910 has a number of annular surfaces that descend stepwise in the height from inner to outer, as mentioned in the descriptions of FIG. 6A-6D. Moreover, if a photoresist pattern including a polygonal pillar part and at least one polygonal annular segment therearound is to be formed, the shape of each partition line 920*a/b* must be made polygonal. This is easily understood based on the above mentioned and is therefore not illustrated in the drawings.

As mentioned above, in the second embodiment, a microlens in the peripheral portion with incident angles of light overly deviating from 90° has an asymmetric vertical cross section to make the exit angle of light from the microlens close to 90°. Hence, each microlens in the central part and the peripheral part are allowed to align with the corresponding photodiode without a lateral shift relative thereto. Thereby, the interconnect structures under the peripheral part of the microlens array are not necessary to shift, so that no modification is required for the interconnect circuit design.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A contiguous microlens array consisting of a plurality of touching microlenses with the same size, wherein each microlens has substantially circular contours at heights higher than connection sections of the microlens with neighboring microlenses and has substantially partially circular contours at heights on the connection sections adjacent to the neighboring microlenses.

2. A contiguous microlens array, comprising a plurality of contiguous microlenses and being disposed over an array of photosensing devices with one microlens therein corresponding to one photosensing device in the array of photosensing devices;
   wherein each of the plurality of contiguous microlens has substantially circular contours at heights higher than connection sections of the microlens with neighboring microlenses and has substantially partially circular contours at heights on the connection sections adjacent to the neighboring microlenses; and
   wherein:
   the microlens array is divided into a central part and at least one peripheral part therearound according to different incident angles of incident light;
   a microlens in the central part is aligned with the corresponding photosensing device; and
   a microlens in the at least one peripheral part is laterally shifted relative to the corresponding photosensing device.

3. The contiguous microlens array of claim 2, wherein a surface of each microlens is substantially a curved surface.

4. A contiguous microlens array comprising a plurality of contiguous microlenses with the same size, wherein each microlens has substantially circular contours at heights higher than connection sections of the microlens with neighboring microlenses and has substantially partially circular contours at heights on the connection sections adjacent to the neighboring microlenses.

5. The contiguous microlens array of claim 4, which is disposed over an array of photosensing devices with one microlens therein corresponding to one photosensing device in the array of photosensing devices, wherein
   each microlens is substantially symmetric in any vertical cross-sectional view;
   the microlens array is divided into a central part and at least one peripheral part therearound according to different incident angles of incident light;
   a microlens in the central part is aligned with the corresponding photosensing device; and a microlens in the at least one peripheral part is laterally shifted relative to the corresponding photosensing device.

6. A contiguous microlens array, comprising a plurality of contiguous microlenses and being disposed over an array of photosensing devices which one microlens therein corresponding to one photosensing device in the array of photosensing devices;
   wherein each of the plurality of contiguous microlens has substantially circular contours at heights higher than connection sections of the microlens with neighboring microlenses and has substantially partially circular contours at heights on the connection sections adjacent to the neighboring microlenses; and
   wherein:
   each microlens is aligned with the corresponding photosensing device;
   the microlens array is divided into a central part and at least one peripheral part therearound according to different incident angles of incident light;
   a microlens in the at least one peripheral part has an asymmetric vertical cross section.

7. The contiguous microlens array of claim 6, wherein a surface of any microlens is substantially a curved surface.

8. The contiguous microlens array of claim 7, wherein in the central part of the microlens array, a surface of a microlens is substantially a partial spherical surface.

9. The contiguous microlens array of claim 1, which is disposed over an array of photosensing devices which one microlens therein corresponding to one photosensing device in the array of photosensing devices, wherein
   each microlens is aligned with the corresponding photosensing device;
   the microlens array is divided into a central part and at least one peripheral part therearound according to different incident angles of incident light;
   a microlens in the central part is substantially symmetric in any vertical cross-sectional view; and
   a microlens in the at least one peripheral part has an asymmetric vertical cross section.

10. A photomask for defining a contiguous microlens array, including a transparent substrate and an array of photomask patterns thereon, wherein in the array of photomask patterns,
    one photomask pattern is for defining a photoresist pattern as a precursor of one microlens in the contiguous microlens array, wherein the photoresist pattern has a substantially circular or polygonal shape in a top view;
    neighboring photomask patterns are disposed apart from each other by a distance that allows neighboring photoresist patterns defined thereby to be connected with each other or be close to each other; and
    each photomask pattern has a transparency distribution such that it can define a photoresist pattern having a surface with a non-uniform height distribution and a height of the surface decreases from inner to outer.

11. The photomask of claim 10, wherein each photomask pattern has therein at least one annular partition line that exposes a portion of the transparent substrate and has a substantially circular or polygonal shape.

12. The photomask of claim 11, wherein
    the contiguous microlens array is formed over an array of photosensing devices, wherein one microlens corresponds to one photomask pattern and one photosensing device;
    in each photomask pattern, a center of the at least one annular partition line coincides with a center of the photomask pattern;

the microlens array is divided into a central part and at least one peripheral part therearound according to different incident angles of incident light;

the photomask pattern for defining a microlens in the central part is aligned with the corresponding photosensing device; and the photomask pattern for defining a microlens in the at least one peripheral part is laterally shifted relative to the corresponding photosensing device.

13. The photomask of claim 12, wherein the array of photosensing devices is an array of photodiodes or an array of charge-coupled devices (CODs).

14. The photomask of claim 11, wherein the contiguous microlens array is formed over an array of photosensing devices, wherein one microlens corresponds to one photomask pattern and one photosensing device;

a region in which a photomask pattern is located is aligned with the corresponding photosensing device;

the microlens array is divided into a central part and at least one peripheral part therearound according to different incident angles of incident light;

in a photomask pattern for defining a microlens in the central part, a center of the at least one annular partition line coincides with a center of a region in which the photomask pattern is located; and in a photomask pattern for defining a microlens in the at least one peripheral part, a center of the at least one annular partition line is shifted relative to a center of a region in which the photomask pattern is located.

15. The photomask of claim 14, wherein the array of photosensing devices is an array of photodiodes or an array of charge-coupled devices (CCDs).

16. The contiguous microlens array of claim 1, wherein each connection section has a thickness close to zero.

17. The contiguous microlens array of claim 2, which is disposed over a photodiode array with at least one interconnect layer between them.

18. The contiguous microlens array of claim 17, which is disposed over a color filter array that is disposed over the at least one interconnect layer.

* * * * *